United States Patent
Sakamuri et al.

(10) Patent No.: US 10,345,707 B2
(45) Date of Patent: Jul. 9, 2019

(54) STRIPPING PROCESS

(71) Applicant: Fujifilm Electronic Materials U.S.A., Inc., N. Kingstown, RI (US)

(72) Inventors: Raj Sakamuri, Sharon, MA (US); Sanjay Malik, Attleboro, MA (US); Ognian Dimov, Warwick, RI (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 15/813,431

(22) Filed: Nov. 15, 2017

(65) Prior Publication Data
US 2018/0136563 A1 May 17, 2018

Related U.S. Application Data

(60) Provisional application No. 62/423,323, filed on Nov. 17, 2016.

(51) Int. Cl.
| | | |
|---|---|---|
| *G03F 7/42* | (2006.01) | |
| *C08G 73/10* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |
| *H01L 21/306* | (2006.01) | |
| *H01L 21/3065* | (2006.01) | |
| *G03F 7/037* | (2006.01) | |
| *G03F 7/11* | (2006.01) | |
| *H01L 21/311* | (2006.01) | |

(52) U.S. Cl.
CPC ......... *G03F 7/425* (2013.01); *C08G 73/1067* (2013.01); *G03F 7/037* (2013.01); *G03F 7/11* (2013.01); *G03F 7/16* (2013.01); *G03F 7/168* (2013.01); *G03F 7/2006* (2013.01); *G03F 7/325* (2013.01); *G03F 7/40* (2013.01); *G03F 7/405* (2013.01); *G03F 7/427* (2013.01); *H01L 21/3065* (2013.01); *H01L 21/30604* (2013.01); *H01L 21/31133* (2013.01)

(58) Field of Classification Search
None
See application file for complete search history.

(56) References Cited

U.S. PATENT DOCUMENTS

| | | | |
|---|---|---|---|
| 5,109,430 A | 4/1992 | Nishihara et al. | |
| 5,798,323 A | 8/1998 | Honda et al. | |
| 6,495,311 B1 * | 12/2002 | Khan | G11B 5/3153 216/40 |
| 7,224,282 B2 | 5/2007 | Terauchi et al. | |
| 8,231,733 B2 | 7/2012 | Egbe et al. | |
| 8,974,215 B2 | 3/2015 | Landis et al. | |
| 2016/0254164 A1 | 9/2016 | Sugishima et al. | |

FOREIGN PATENT DOCUMENTS

| | | | | |
|---|---|---|---|---|
| JP | 5062562 | 10/2012 | ............... | G03F 7/40 |
| WO | WO 2015/089023 | 6/2015 | ............... | C11D 7/32 |

OTHER PUBLICATIONS

International Search Report and Written Opinion of the International Searching Authority for International Application No. PCT/US17/61692 dated Jan. 26, 2018.
Wood et al., "Salicylaldoxime-III at 150 K", *Acta Crystallographica Section E*, vol. E62, No. 9, pp. o3944-o3946 (Sep. 2006).

* cited by examiner

*Primary Examiner* — Roberts P Culbert
(74) *Attorney, Agent, or Firm* — Fish & Richardson P.C.

(57) ABSTRACT

This disclosure relates to a process for stripping an organic film on a patterned semiconductor substrate. The process includes treating the organic film with an aqueous stripper composition to remove the organic film in one step. The organic film includes at least a first layer and a second layer, the first layer has a dissolution rate of at most about 0.01μ/min in a developer at 25° C., and the second layer has a dissolution rate of greater than about 0.01μ/min in the developer at 25° C.

21 Claims, No Drawings

STRIPPING PROCESS

The present application claims priority to U.S. Provisional Application Ser. No. 62/423,323, filed on Nov. 17, 2016, the contents of which are hereby incorporated by reference in their entirety.

BACKGROUND OF THE DISCLOSURE

The continued expansion of mobile computing applications requires the packing of ever growing levels of computing power in smaller device footprints. Designers of semiconductor devices are relying on the use of a variety of new chip architectures to meet the new device requirements. These new architectures include flip chip wafer bumping using copper pillars as well as approaches employing through silicon vias (TSV) such as three-dimensional integrated circuits (3D IC) in which wafers are thinned, the resulting dies are stacked and then connected by TSV and 2.5D interposer designs. These approaches pose significant challenges not only for the designers of these new IC architectures, but for the designers of the packaging materials that will be used for these devices.

Often times when constructing these new IC architectures, it becomes necessary to remove two or more polymeric resist layers at the same time. Many times these polymeric layers are composed of materials with vastly different solubility characteristics. A thorough understanding of the characteristics of each polymeric layer is required if removal of both layers is to occur without compromising the integrity of the underlying substrate. Many traditional chemical strippers used in the semiconductor industry are extremely harsh and it is often not possible to use a single stripper to remove all layers without concomitant damage to the underlying substrate. This fact prohibits the use of conventional chemical strippers, and their accompanying processes, in the manufacture of new complex IC architectures. The designers of new advanced materials for semiconductor packaging require strippers that are both potent and selective in their action.

It was unexpectedly discovered that the compositions of this disclosure can remove multiple layers of different dissolution or solubility properties in an organic film on a patterned semiconductor substrate in one step without damaging the substrate or its structure.

SUMMARY OF THE DISCLOSURE

The present disclosure features a process for stripping an organic film on a patterned semiconductor substrate (e.g., a patterned metal containing semiconductor substrate). The process includes treating the organic film with an aqueous stripper composition to remove the organic film in one step. The organic film includes at least a first layer and a second layer, the first layer has a dissolution rate of at most about 0.01 μm/min in a developer at 25° C., and the second layer has a dissolution rate of greater than about 0.01 μm/min in the developer at 25° C.

In some embodiments, the present disclosure features a three-dimensional object formed by the processes described above. In some embodiments, the present disclosure features a semiconductor device that includes the three dimensional object. In some embodiments, the semiconductor device is an integrated circuit, a light emitting diode, a solar cell, or a transistor.

DETAILED DESCRIPTION OF THE DISCLOSURE

Some embodiments of this disclosure describe a process for stripping an organic film (e.g., a multi-layer or multi-stacked organic film) having different dissolution or solubility properties on a patterned semiconductor substrate (e.g., a patterned metal containing semiconductor substrate) in one step by using an aqueous stripper composition. The organic film can include at least a first layer and a second layer. The first layer (e.g., a highly cross-linked layer) can be insoluble in a developer at 25° C. The second layer (e.g., a lightly cross-linked layer or a layer that is not cross-linked) can have a higher solubility in a developer than the first layer at 25° C. In some embodiments, the second layer can be soluble in a developer at 25° C. In some embodiments, the organic film can include more than two (e.g., three, four, five, six, or seven) layers, some of which have dissolution/solubility properties similar to the first layer and some of which have dissolution/solubility properties similar to the second layer.

In some embodiments, the first layer is insoluble in a developer at 25° C. For example, the first layer can have a dissolution rate of at most about 0.01 μm/min (e.g., at most about 0.005 μm/min, at most about 0.001 μm/min, at most about 0.0005 μm/min, or at most about 0.0001 μm/min) in a developer at 25° C. The developer can include at least one organic solvent, at least one aqueous solution (e.g., a solution in the pH range of 2-14), or a mixture thereof. Examples of organic solvents that can be used as a suitable developer include, but are not limited to, gamma-butyrolactone (GBL), N-methyl-2-pyrrolidone (NMP), dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol, 2,5-dimethyl ether (2,5-dimethylisosorbide), 1,4:3,6-dianhydrosorbitol 2,5-diethyl ether (2,5-diethylisosorbide) and mixtures thereof. In some embodiments, organic solvents that can be used as a developer include n-butyl acetate (nBA), propylene glycol methyl ether acetate (PGMEA), propylene glycol methyl ether (PGME), ethyl lactate (EL), propyl lactate, 3-methyl-3-methoxybutane and mixture thereof. Examples of aqueous solutions that can be used as a developer include, aqueous alkaline solutions (e.g., a TMAH solution) and aqueous acidic solutions. In some embodiments, the developer can be the aqueous stripper composition described herein. In some embodiments, the first layer has a weight average molecular weight of at least about 20,000 g/mol (e.g., at least about 30,000 g/mol, at least about 40,000 g/mol, at least about 50,000 g/mol, at least about 60,000 g/mol, at least about 70,000 g/mol, at least about 80,000 g/mol, at least about 90,000 g/mol, or at least about 100,000 g/mol).

In some embodiments, the first layer can have a solubility in the above-mentioned developer that is less than about 1 gram (e.g., less than about 0.5 g, less than about 0.1 g, less than about 0.05 g, or less than about 0.01 g) in 1000 grams of the developer at 25° C.

In some embodiments, the second layer has a higher solubility at 25° C. than the first layer in the same developer described above. For example, the second layer can have a dissolution rate greater than about 0.01 µm/min (e.g., greater than about 0.05 µm/min, greater than about 0.1 µm/min, greater than about 0.5 µm/min, or greater than about 1 µm/min) in a developer at 25° C. In some embodiments, the second layer can have a solubility in the above-mentioned developer that is greater than about 1 gram (e.g., greater than about 5 g, greater than about 10 g, greater than about 50 g, or greater about 100 g) in 1000 grams of the developer at 25° C. In some embodiments, the second layer can be soluble in the developer (e.g., having a dissolution rate of greater than 1 µm/min or having a solubility of greater than 50 g in 1000 grams of the developer) at 25° C. In some embodiments, the second layer has a weight average molecular weight of at most about 200,000 g/mol (e.g., at most about 150,000 g/mol, at most about 100,000 g/mol, at most about 50,000 g/mol, at most about 25,000 g/mol, at most about 10,000 g/mol, at most about 5,000 g/mol, or at most about 3,000 g/mol).

Semiconductor substrates could have a circular shape such as wafers or they could be panels. In some embodiments, the semiconductor substrate can be a silicon substrate, a copper substrate, an aluminum substrate, a silicon oxide substrate, a silicon nitride substrate, a glass substrate, an organic laminate substrate, or a dielectric material substrate. The substrate may contain metallic patterns of lines, pillars, pads or other structures with different lengths or sizes. Metal used for the metallic patterns include, but are not limited to, copper, aluminum, tungsten, and alloys thereof.

In some embodiments, the patterned semiconductor substrate can include at least one element having a feature size of at most about 5 microns (e.g., at most about 4 microns, at most about 3 microns, at most about 2 microns, or at most about 1 micron).

In some embodiments, the patterned semiconductor substrate can include a plurality of patterns. In some embodiments, two of the patterns (e.g., those within a group of patterns) can be separated by a space of at most about 200 microns (e.g. at most about 175 microns, at most about 150 microns, at most about 125 microns, at most about 100 microns, at most about 75 microns, at most about 50 microns, at most about 25 microns, at most about 10 microns, at most about 4 microns, or at most about 2 microns).

In some embodiments, the patterned semiconductor substrate can include a plurality of groups of patterns. In some embodiments, two groups of patterns can be separated by a space of at most about 100 millimeters (e.g., at most about 75 millimeters, at most about 50 millimeters, at most 100 millimeters, at most 50 millimeters, at most about 10 millimeters, at most about 5 millimeters, at most about 1000 microns (1 millimeter), at most about 500 microns, at most about 250 microns, or at most about 100 microns).

In some embodiments, the thickness of the first layer, the second layer, or any other layers in the organic film can independently range from at least about 2 microns (e.g., at least about 3 microns, at least about 4 microns, at least about 5 microns, or at least about 10 microns) to at most about 40 µm (e.g., at most about 35 microns, at most about 30 microns, at most about 25 microns, or at most about 20 microns). The appropriate film thickness employed can be determined by the specific application.

In some embodiments, the total thickness of the organic film formed on a patterned semiconductor is preferably from at least about 20 microns (e.g., at least about 25 microns, at least about 30 microns, at least about 35 microns, or at least about 40 microns) to at most about 100 microns (e.g., at most about 90 microns, at most about 80 microns, at most about 70 microns, or at most about 60 microns). The appropriate film thickness employed can be determined by the specific application.

In some embodiments, the aqueous stripper composition that can be used in the stripping process described herein includes: (a) an alkaline compound in the amount of about 0.5 to about 25 percent by weight of the composition; (b) water in the amount of about 65 to 95 percent by weight of the composition; (c) a corrosion inhibitor compound in the amount of about 0.1 to about 5 percent by weight of the composition; and (d) a surfactant in the amount of 0 to about 5 percent by weight of the composition.

The alkaline compounds (a) that can be used in the stripper composition described herein are not particularly limited and are well known to those of ordinary skill in the art. For example, the alkaline compounds can include inorganic bases, such as, potassium hydroxide, sodium hydroxide, sodium carbonate, sodium bicarbonate, potassium carbonate, and potassium bicarbonate; and organic bases, such as, quaternary ammonium salts. In some embodiments, the alkaline compounds are quaternary ammonium salts. Examples of the quaternary ammonium salts include, but are not limited to, quaternary ammonium hydroxides, which can be selected from a group consisting of tetramethyl ammonium hydroxide (TMAH), 2-hydroxyltrimethyl ammonium hydroxide, tetraethyl ammonium hydroxide (TEAH), tetrapropyl ammonium hydroxide (TPAH), tetrabutyl ammonium hydroxide (TBAH), and a mixture thereof. In certain embodiments, the quaternary ammonium hydroxides are tetramethyl ammonium hydroxide and 2-hydroxyltrimethyl ammonium hydroxide. In some embodiments, the quaternary ammonium hydroxide is tetramethyl ammonium hydroxide.

The alkaline compounds (a) used in the stripper composition can be present in an amount of at least about 0.5 weight % (e.g., at least about 1 weight %, at least about 1.5 weight %, at least about 2 weight %, at least about 2.5 weight %, at least about 3 weight %, at least about 4 weight %, or at least about 5 weight %) to at most about 25 weight % (e.g., at most about 20 weight %, at most about 15 weight %, or at most about 10 weight %) relative to the total amount of the composition of the disclosure.

Corrosion inhibitor compounds used in the stripper composition can include, but are not limited to, aromatic hydroxyl compounds, acetylenic alcohols, carboxyl group containing organic compounds and anhydrides thereof, tetrazole compounds, and triazole compounds as long as they have reasonable solubility in the stripper composition.

Examples of aromatic hydroxyl compounds include, but are not limited to, phenol, cresol, xylenol, pyrocatechol, resorcinol, hydroquinone, pyrogallol, 1.2.4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2-5-dihydroxybenzoic acid, 3,4-dihydroxybenzoic acid, and 3,5-dihydroxybenzoic acid.

Examples of acetylenic alcohols include, but are not limited to, 2-butyne-1,4-diol, 3,5-dimethyl-1-hexyn-3-ol, 2 methyl-3-butyn-2-ol, 3-methyl-1-pentyn-3-ol, 3,6-dimethyl-4-octyn-3,6-diol, 2,4,7,9-tetramethyl-5-decyne-4,7-diol, and 2,5-dimethyl-3-hexyne 2,5-diol.

Examples of carboxyl group containing organic compounds and anhydrides thereof include, but are not limited to, formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, salicylic acid, and the anhydrides thereof.

Examples of triazole compounds include, but are not limited to, 1,2,4-triazole, or triazoles optionally substituted with substituents such as $C_1$-$C_8$ alkyl, amino, thiol, mercapto, imino, carboxy and nitro groups. Examples of triazole compounds include benzotriazole, tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-amino-1,2,4-triazole-5-carboxylic acid, 3-mercapto-1,2,4-triazole, 3-isopropyl-1,2,4-triazole, 5-phenylthiol-benzotriazole, halo-benzotriazoles (halo=F, Cl, Br or I), naphthotriazole, and the like.

In some embodiments, the corrosion inhibitor compound is an oxime compound of Structure (I):

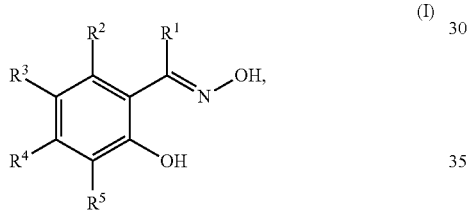

(I)

in which $R^1$ is selected from the group consisting of hydrogen, substituted or unsubstituted $C_1$-$C_{12}$ linear or branched alkyl, substituted or unsubstituted $C_5$-$C_{12}$ cycloalkyl or heterocycloalkyl, and substituted or unsubstituted $C_5$-$C_{12}$ aryl or heteroaryl; and $R^2$ to $R^5$ are each independently selected from the group consisting of hydrogen, halogen, substituted or unsubstituted $C_1$-$C_{12}$ linear or branched alkyl, substituted or unsubstituted $C_5$-$C_{12}$ cycloalkyl or heterocycloalkyl, and substituted or unsubstituted $C_5$-$C_{12}$ aryl or heteroaryl; or any two adjacent groups of $R^2$ to $R^5$ (e.g., $R^2$ and $R^3$, $R^3$ and $R^4$, or $R^4$ and $R^5$), together with the ring carbon atoms to which they are attached, form a six-membered ring.

In some embodiments, $R^1$ is hydrogen, substituted or unsubstituted $C_1$-$C_{12}$ linear or branched alkyl, or substituted or unsubstituted $C_6$-$C_{12}$ aryl. Examples of $R^1$ groups include, but are not limited to, hydrogen, methyl, and phenyl. In some embodiments, each of $R^2$ to $R^5$, independently, is hydrogen, halogen, substituted or unsubstituted $C_1$-$C_{12}$ linear or branched alkyl, substituted or unsubstituted $C_5$-$C_{10}$ cycloalkyl or heterocycloalkyl, or substituted or unsubstituted $C_6$-$C_{12}$ aryl or heteroaryl. Examples of $R^2$-$R^5$ groups include, but are not limited to, hydrogen, halogen, nonyl, dodecyl, phenyl, iso-propyl, t-butyl, cyclopentyl, 1,3-dimethylcyclohexyl, and tolyl. The substituents on the compounds of Structure (I) are chosen to optimize a variety of parameters including, but not limited to, the solubility and activity of the oxime compound in a given composition and the storage stability of the composition.

Examples of suitable compounds of Structure (I) include, but are not limited to,

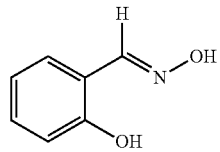

(I-a)

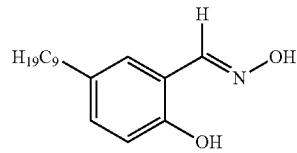

(I-b)

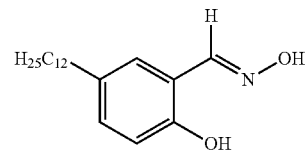

(I-c)

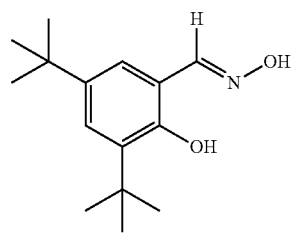

(I-d)

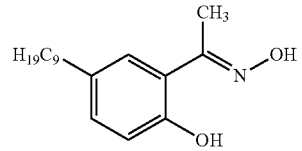

(I-e)

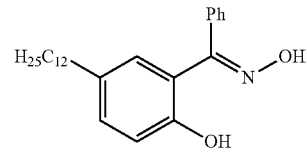

(I-f)

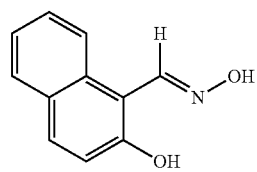

(I-g)

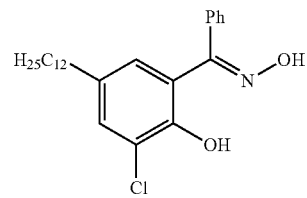

(I-h)

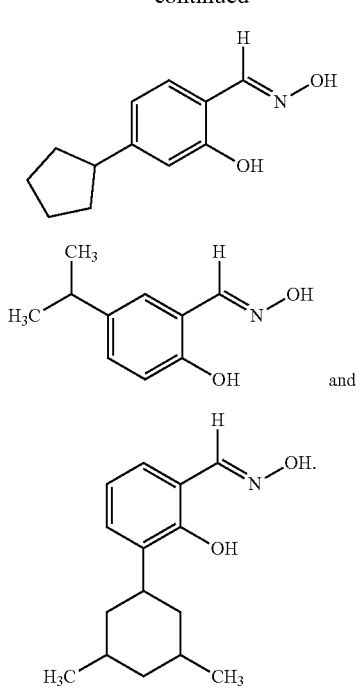

The corrosion inhibitor compound used in the stripper composition can be present in an amount of at least about 0.1 weight % (e.g., at least about 0.2 weight %, at least about 0.3 weight %, at least about 0.4 weight %, at least about 0.5 weight % or at least about 1 weight %) to at most about 5 weight % (e.g., at most about 4 weight %, at most about 3 weight %, at most about 2 weight % or at most about 1.5 weight %) relative to the total amount of cleaning/stripping composition. In some embodiments, the amount for the corrosion inhibitor compound is from 0.2 weight % to 0.4 weight % relative to the total amount of cleaning/stripping composition.

The amount of water (such as deionized water, pure water, ultrapure water, etc.) used in the stripper composition can be at least about 65 weight % (e.g., at least about 70 weight %, at least about 75 weight % or at least about 78 weight %) to at most about 95 weight % (e.g., at most about 90 weight %, at most about 85 weight %, or at most about 82 weight %) relative to the total amount of cleaning/stripping composition.

Suitable surfactants that can be used in the stripper composition include, without limitation, fluoroalkyl surfactants; polyethylene glycols; polypropylene glycols; polyethylene glycol ethers; polypropylene glycol ethers; carboxylic acid salts; dodecylbenzenesulfonic acid and salts thereof; polyacrylate polymers; dinonylphenyl polyoxyethylene; silicone polymers; modified silicone polymers; acetylenic diols; modified acetylenic diols, alkylammonium salts; modified alkylarnmonium salts; alkylammonium sulfonic acid inner salts, and combinations of two or more of the foregoing. Examples of suitable surfactants include, but are not limited to, the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

The amount of surfactants used in the stripper composition can be at least about 0.001 weight % (e.g., at least about 0.005 weight %, at least about 0.01 weight %, at least about 0.02 weight %, at least about 0.03 weight %, at least about 0.04 weight %, or at least about 0.05 weight %) to at most about 5 weight % (e.g., at most about 2.5 weight %, at most about 1 weight %, at most about 0.5 weight %, at most about 0.25 weight %, or at most about 0.1 weight %) relative to the total amount of the stripper composition. In some embodiments, the stripper composition does not include any surfactant.

The stripper composition described herein can also include one or more of the following additives provided that these additives do not adversely affect the stripping performance of the composition nor damage the underlying substrate surface: chelating agents, coupling agents, chemical modifiers, dyes, biocides, and/or other additives, each of which can be in an amount up to 5 percent by weight based on the total weight of the composition.

Examples of chelating agents can include, but are not limited to, ethylenediaminetetraacetic acid (EDTA), hydroxyethylethylenediaminetriacetic acid (HEDTA), penicillamine, 2,3-dimercapto-1-propanesulfonic acid (DMPS), dimercaptosuccinic acid (DMSA), gluconic acid, acrylic acid, nitrilotriacetic acid (NTA), glutamic acid, diacetic acid, tetrasodium iminodisuccinate, iminosuccinic acid, pentasodium diethylenetriamine pentacetate, and polyaspartate. In some embodiments, the chelating agent can be EDTA.

The stripper composition can further include a coupling agent. A coupling agent can aid in stabilization of the composition, such as maintaining shelf life. Examples of coupling agents can include, but are not limited to, sodium xylene sulfonate (SXS), sodium cumene sulfonate (SCS), and ethyl hexyl sulfonate (EHS). In certain embodiments, the coupling agent is sodium xylene sulfonate.

In some embodiments, one or more of the following materials may be excluded from the compositions of this disclosure: fluorine containing compounds which hydrolyses to release fluorine (e.g., latent HF sources such as carboxyl fluorides), fluoride salts such as ammonium or quaternary ammonium fluorides, oxidizing reagents such as peroxides and inorganic oxidizing agents, amidine salts such as guanidinium salt, acetamidinium salt, and formamidinium salt, urea and urea derivatives, and phenolic compounds.

In some embodiments, the stripper composition can have a basic pH. For example, the pH can be at least about 12 (e.g., at least about 12.2, at least about 12.4, at least about 12.6, at least about 12.8, at least about 13, at least about 13.2, at least about 13.4, at least about 13.6, at least about 13.8, or at least about 14) or at most about 16.0 (e.g., at most about 15.8, at most about 15.6, at most about 15.4, at most about 15.2, at most about 15.0, at most about 14.8, at most about 14.6, at most about 14.4, or at most about 14). In some embodiments, the pH range is from 13.5 to 15.5 (such as from 14 to 15.3).

The stripper composition can be prepared by mixing various components in any order using conventional mixing methods. The components may be mixed cold, without the addition of heat.

In some embodiments, the stripper composition of this disclosure can be used in processes for removing the organic film containing at least two layers of different dissolution or solubility properties described herein.

The removing (stripping) process can be accomplished by treating the organic film described herein with one or more of the stripper compositions using known techniques such as immersion, spray, and ultrasonic/megasonic bath. One advantage of this process is that the aqueous stripper composition of this disclosure can strip all layers of the organic film including the first and second layers described above in one step, without dissolving the first layer that may be in insoluble in the stripper composition. In some embodiments, without wishing to be bound by theory, it is believed that the stripper composition can lift the entire organic film from the patterned semiconductor substrate without dissolving the first layer, thereby stripping the organic film from the substrate in one step.

In some embodiments, substantially no residue of the organic film remains after the completion of stripping process. In some embodiments, the thickness of any film residue left relative to the original film thickness is less than about 5% (e.g. less than about 4%, less than about 3%, less than about 2% or less than about 1%). In case that some minor amount of film residue remains at the top of the patterned semiconductor substrate, the film residue can be completely removed by a plasma etching step which is known to those skilled in the art.

Temperatures employed in the stripping process can be at least about 25° C. (e.g., at least about 30° C., at least about 35° C., at least about 40° C., or at least about 45° C.) to at most about 85° C. (e.g., at most about 80° C., at most about 75° C., at most about 70° C., at most about 65° C., at most about 60° C., or at most about 55° C.). The stripping time can be at least about 15 minutes (e.g., at least about 30 minutes, at least about 45 minutes, or at least about 60 minutes) to at most about 120 minutes (e.g., at most about 105 minutes, at most about 90 minutes, or at most about 75 minutes).

Optional steps in the stripping process include rinsing steps, drying steps, and plasma etching steps, which can be performed after the semiconductor substrate is treated by the stripper composition. For example, after treatment with the stripper composition, the semiconductor substrate can be rinsed with a rinse solvent (e.g., water or an aqueous solution). Aqueous solutions that can be used in this process could be a mixture of DI-water and a surfactant, a slightly basic aqueous solution containing a surfactant, or an aqueous solution containing linear or branched C1-C4 alcohols to remove the stripper composition and any other residues. This step can also be accomplished by using known techniques such as immersion, centrifugal spray, megasonic cleaning, and ultrasonic cleaning. The rinsed semiconductor substrate can then be dried using drying means known to those skilled in the art.

EXAMPLES

Synthesis Example 1

Polymer (Poly-1)

Solid 4,4'-(hexafluoroisopropylidene)diphthalic anhydride (6FDA) (334.0 g) was charged to a solution of 5(6)-amino-1-(4-aminophenyl)-1,3,3-trimethylindane (DAPI) (218.4 g) in NMP (2206 g) at room temperature. Additional NMP (816 g) was used to rinse the dianhydride into solution. The reaction temperature was increased to 60° C. and the mixture was allowed to react for 3.5 hours. Next, acetic anhydride (125.7 g) and pyridine (49.5 g) were added. After the reaction temperature was increased to 100° C., the mixture was allowed to react for 12 hours. The reaction mixture was then cooled to room temperature and diluted with an equal volume of THF. The diluted solution was slowly added to water (10×) to precipitate the crude polymer. The crude polymer was isolated by vacuum filtration and washed with water. The crude wet polymer was slurried with methanol, collected by vacuum filtration and dried under vacuum at 45° C. overnight.

Composition Example 1a

Formulation to Coat First Layer (F-1)

To a 3-neck round bottom flask equipped with a mechanical stirrer was added 20 parts of PGMEA, 8 parts of PGME, 16 parts of polymer (Elvacite 4412-poly(methyl methacrylate-co-hydroxypropyl methacrylate) from Lucite International, 2.4 parts of TAG-2168E (25% in PGME) from King Industries, 3 parts of powderlink 1174, 4 parts of poly T-305 from Arch Chemical. The composition was mechanically stirred for 18 hours. This composition was then filtered by using a 5 μm filter.

Composition Example 1b

Formulation to Create Dry Film (F-2)

To a 3-neck round bottom flask equipped with a mechanical stirrer was added 300 parts of cyclopentanone, 100 parts of the polymer obtained in Synthesis Example 1 (Poly-1), 5 parts of 3-(methacryloyloxy)propyltrimethoxy-silane, 3 parts of NCI-831 (trade name, available from ADEKA corporation), 31.75 parts of tetraethylene glycol diacrylate, 11.25 parts of pentaerithritol triacrylate. The composition was mechanically stirred for 18 hours. This composition was then filtered by using a 0.2 μm filter (Ultradyne from Meissner Filtration Product, Inc.).

Preparation of Dry Film (DF-1)

The filtered photosensitive solution (F-2) was applied via slot-die coater from Frontier Industrial Technologies (Towanda, Pa.) with line speed of 5 feet/minutes (150 cm per minutes) onto a polyethylene terephthalate (PET) film TA 30 (manufactured by Toray Plastics America, Inc.) having a thickness of 36 μm used as a carrier substrate and dried at 180-200° F. to obtain polymeric layer with thickness of 15 microns (DF-1). On this polymeric layer, a biaxially oriented polypropylene (BOPP) films (manufactured by IMPEX GLOBAL LLC, trade name 80ga BOPP) was laminated by a roll compression to act as a protective layer.

Preparation of Highly Cross-Linked Layer (HCL-1)

A four inch wafer containing copper structures is coated with formulation (F-1) followed by two stage softbake process (90° C. for 3 minutes and 130° C. for 3 minutes) to obtain a film of 20 μm. The film is then thermally cured at 160° C. for 30 minutes to produce a highly cross-linked layer.

Lamination of Dry Film Example (L-1)

After the removal of the protective layer of DF-1 by peeling, the polymeric layer of the dry film structure (6"×6") is placed on the 4 inch structured wafer containing the highly cross-linked layer (HCL-1). The polymeric layer is laminated onto the highly cross-linked layer (HCL-1) by vacuum lamination at 80° C. followed by being subjected to a pressure of 25 psi. Lamination process is done by using a DPL-24A Differential Pressure Laminator manufactured by OPTEK, NJ.

Imaging of Dry Film Example (I-1)

The laminated dry film (L-1) is exposed to 365 nm (i-line source) at a dose of 150 mJ/cm$^2$ using a mask to print various line/space and contact hole features. It is then developed using cyclopentanone. The film is then baked at 120° C. for 30 minutes under vacuum.

Stripping of Polymeric Films Example (S-1)

The wafer with film-stack consisting of the above two layers is cut into 1"×2" pieces and placed vertically in a 600 ml beaker containing 300 ml of aqueous stripper solution containing 4.78% TMAH, 94.87% deionized water and 0.35% of 1H-tetrazole. The contents of the beaker are stirred using a magnetic bar at 75° C. The temperature is maintained constant by using a temperature controller. After 30 minutes, the wafer pieces are removed and immediately rinsed with water and dried using nitrogen purge. The effectiveness of stripping is determined by using an optical microscope and by SEM after gold sputtering. The extent of film thickness loss is determined by measuring the thickness of the remaining film using Dektak profilometer.

What is claimed is:

1. A process for stripping an organic film on a patterned semiconductor substrate, comprising:
   treating the organic film with an aqueous stripper composition, thereby removing the organic film in one step;
   wherein the organic film comprises at least a first layer and a second layer, the first layer has a dissolution rate of at most about 0.01 μm/min in a developer at 25° C., and the second layer has a dissolution rate of greater than about 0.01 μm/min in the developer at 25° C.

2. The process of claim 1, wherein the first layer is cross-linked.

3. The process of claim 1, wherein the patterned semiconductor substrate comprises at least one element having a feature size of at most about 5 micron.

4. The process of claim 1, wherein the patterned semiconductor substrate comprises two patterns separated by a space of at most about 200 microns.

5. The process of claim 1, wherein the patterned semiconductor substrate comprises two groups of patterns and the two groups are separated by a space of at most about 100 millimeters.

6. The process of claim 1, wherein substantially no film residue of the organic film remains after the treatment step.

7. The process of claim 1, wherein, after the treatment step, the residue of the organic film has a thickness that is less than about 5% of the original film thickness.

8. The process of claim 1, further comprising performing a plasma treatment to the patterned semiconductor substrate after the treatment step.

9. The process of claim 1, further comprising rinsing the patterned semiconductor substrate with a rinse solvent after the treatment step.

10. The process of claim 9, further comprising drying the patterned semiconductor substrate after the rinsing step.

11. The process of claim 1, wherein the patterned semiconductor substrate comprises a metal.

12. The process of claim 1, wherein the aqueous stripper composition comprises:
   an alkaline compound in the amount of about 0.5 to about 25 percent by weight of the composition;
   water in the amount of about 65 to 95 percent by weight of the composition;
   a corrosion inhibitor compound in the amount of about 0.1 to about 5 percent by weight of the composition; and
   a surfactant in the amount of 0 to about 5 percent by weight of the composition.

13. The process of claim 12, wherein the alkaline compound is selected from the group consisting of tetramethyl ammonium hydroxide (TMAH), 2-hydroxyltrimethyl ammonium hydroxide, tetraethyl ammonium hydroxide (TEAH), tetrapropyl ammonium hydroxide (TPAH), tetrabutyl ammonium hydroxide (TBAH), and a mixture thereof.

14. The process of claim 12, wherein the corrosion inhibitor is a tetrazole, a triazole, a benzotriazole, a substituted triazole, or a substituted benzotriazole.

15. The process of claim 12, wherein the corrosion inhibitor is a compound of Structure (I)

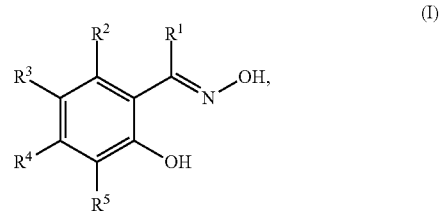

wherein
   $R^1$ is selected from the group consisting of hydrogen, substituted or unsubstituted $C_1$-$C_{12}$ linear or branched alkyl, substituted or unsubstituted $C_5$-$C_{12}$ cycloalkyl or heterocycloalkyl, and substituted or unsubstituted $C_5$-$C_{12}$ aryl or heteroaryl; and
   $R^2$ to $R^5$ are each independently selected from the group consisting of hydrogen, halogen, substituted or unsubstituted $C_1$-$C_{12}$ linear or branched alkyl, substituted or unsubstituted $C_5$-$C_{12}$ cycloalkyl or heterocycloalkyl, and substituted or unsubstituted $C_5$-$C_{12}$ aryl or heteroaryl; or any two adjacent groups of $R^2$ to $R^5$, together with the ring carbon atoms to which they are attached, form a six-membered ring.

16. The process of claim 12, wherein the corrosion inhibitor is

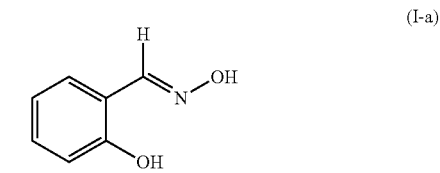

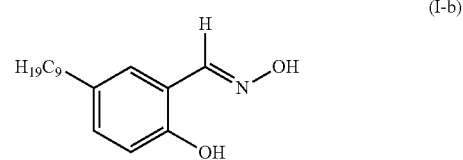

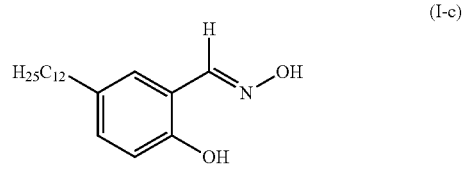

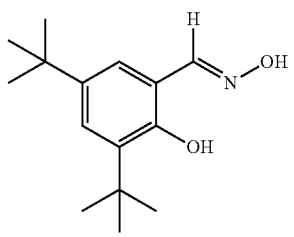 (I-d)

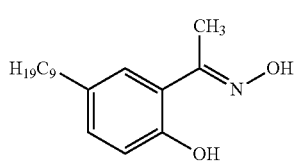 (I-e)

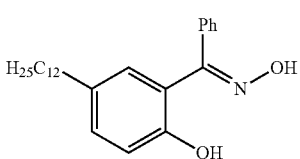 (I-f)

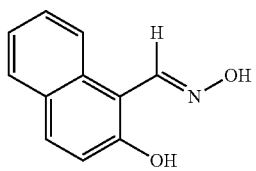 (I-g)

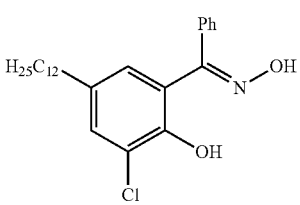 (I-h)

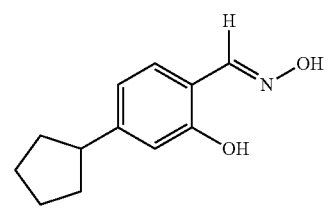 (I-i)

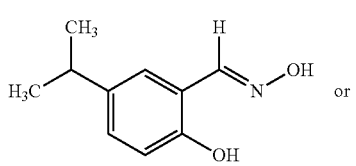 (I-j) or

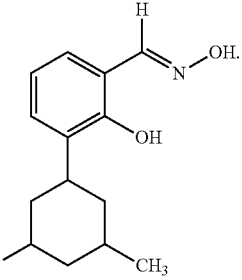 (I-k)

17. A three dimensional object formed by the process of claim 1.

18. A semiconductor device, comprising the three dimensional object of claim 17.

19. The semiconductor device of claim 18, wherein the semiconductor device is an integrated circuit, a light emitting diode, a solar cell, or a transistor.

20. The process of claim 1, wherein the aqueous stripper composition comprises:
   an alkaline compound in the amount of about 0.5 to about 25 percent by weight of the composition;
   water in the amount of about 65 to 95 percent by weight of the composition;
   a corrosion inhibitor compound in the amount of about 0.1 to about 5 percent by weight of the composition; and
   a surfactant in the amount of 0.005 to about 5 percent by weight of the composition.

21. The process of claim 1, wherein the aqueous stripper composition comprises an alkaline compound, water, a corrosion inhibitor compound, and a surfactant, in which the corrosion inhibitor compound is a compound of Structure (I)

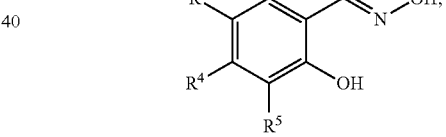 (I)

wherein
   $R^1$ is selected from the group consisting of hydrogen, substituted or unsubstituted $C_1$-$C_{12}$ linear or branched alkyl, substituted or unsubstituted $C_5$-$C_{12}$ cycloalkyl or heterocycloalkyl, and substituted or unsubstituted $C_5$-$C_{12}$ aryl or heteroaryl; and
   $R^2$ to $R^5$ are each independently selected from the group consisting of hydrogen, halogen, substituted or unsubstituted $C_1$-$C_{12}$ linear or branched alkyl, substituted or unsubstituted $C_5$-$C_{12}$ cycloalkyl or heterocycloalkyl, and substituted or unsubstituted $C_5$-$C_{12}$ aryl or heteroaryl; or any two adjacent groups of $R^2$ to $R^5$, together with the ring carbon atoms to which they are attached, form a six-membered ring.

* * * * *